(12) United States Patent
Yang

(10) Patent No.: US 11,463,089 B1
(45) Date of Patent: Oct. 4, 2022

(54) HAPTIC REACTIVE ELECTRICAL SWITCH

(71) Applicant: ALPS ELECTRIC KOREA CO., LTD., Gwangju (KR)

(72) Inventor: Dae Yeon Yang, Gwangju (KR)

(73) Assignee: ALPS ELECTRIC KOREA CO., LTD., Gwangju (KR)

( * ) Notice: Subject to any disclaimer, the term of this patent is extended or adjusted under 35 U.S.C. 154(b) by 0 days.

(21) Appl. No.: 17/505,782

(22) Filed: Oct. 20, 2021

(30) Foreign Application Priority Data

Apr. 16, 2021 (KR) .................. 10-2021-0050124

(51) Int. Cl.
*H03K 17/96* (2006.01)

(52) U.S. Cl.
CPC ... *H03K 17/96* (2013.01); *H03K 2217/96062* (2013.01)

(58) Field of Classification Search
CPC ............... H03K 17/96; H03K 2217/96062
USPC ......................................... 200/293
See application file for complete search history.

(56) References Cited

U.S. PATENT DOCUMENTS

2019/0310099 A1* 10/2019 Lefringhausen ....... H03K 17/96
2021/0160622 A1* 5/2021 Lee ......................... H04R 3/12

FOREIGN PATENT DOCUMENTS

KR         10-1968944 B1     8/2019

* cited by examiner

*Primary Examiner* — Tomi Skibinski
(74) *Attorney, Agent, or Firm* — LRK Patent Law Firm

(57) ABSTRACT

Proposed is a haptic reactive electrical switch including: a movable part including a floating panel having a touch area to which a user's touch is input and a holder coupled to the floating panel; a fixed part including a substrate and a casing configured to accommodate the substrate and be provided with at least two damping members; a vibration transmission plate configured to be interposed between the holder and the casing, thereby interconnecting the movable part and the fixed part; and an actuator configured to be operated to vibrate the holder and the vibration transmission plate coupled to the holder in a horizontal direction according to a user's touch input, wherein each of the damping members is configured in a form of a single object integrated into the casing, and an end part of one side thereof protrudes to a portion above the casing.

16 Claims, 9 Drawing Sheets

HAPTIC REACTIVE ELECTRICAL SWITCH

CROSS REFERENCE TO RELATED APPLICATION

The present application claims priority to Korean Patent Application No. 10-2021-0050124, filed Apr. 16, 2021, the entire content of which is incorporated herein for all purposes by this reference.

BACKGROUND OF THE INVENTION

1. Field of the Invention

The present disclosure relates to an electrical switch for a vehicle capable of outputting a command for executing a desired function through a user's touch input. More particularly, the present disclosure relates to a haptic reactive electrical switch that generates vibration when a user inputs a touch with a force no less than a predetermined force and transmits the vibration to a user's finger as a stimulus.

2. Description of Related Art

In the case of electrical switches applied to vehicles, recently, instead of an analog type in which a function execution command is input through a simple physical manipulation (for example, a push manipulation, a rotation manipulation, or the like), there is a trend to change to a digital type that allows information about the function of the corresponding switch to be displayed and a user to select and execute a desired function through a touch input.

Furthermore, in the case of a recent digital type electrical switch, a haptic function is applied, and when a panel is touched to execute a desired function, the haptic function allows vibration to be fed back in response to the user's touch input (haptic feedback) so that the user may immediately recognize whether his or her touch input has been made accurately. This haptic function is implemented by a means of vibration feedback that responds to the user's touch as vibrations.

"Haptic" refers to a tactile sensation that a user may feel with his or her fingertips (or a stylus pen) when touching an object. The means of vibration feedback for implementing such a haptic response is most ideal, provided the means is capable of reproducing dynamic characteristics with the same reaction as touching a real object (actual button) when the user touches the button displayed on the panel.

Therefore, one of the most important requirements that the means of vibration feedback needs to be provided with is to provide vibration force sufficient for a user to immediately recognize the vibration through the tactile sensation when the user manipulates the panel (touch panel). A rotary vibration motor or a linear vibration motor is widely adopted as the means of vibration feedback applied to an electrical switch to implement a haptic function.

The means of vibration feedback is generally mounted on a touch input unit such as a board (circuit substrate) inside a touch panel, thereby being protected by being covered with the touch panel. Most of the conventional haptic reactive electrical switches have a mechanism of providing tactile feedback to the user by shaking the touch input unit up and down with the vibration generated by the means of vibration feedback.

However, a configuration in which the touch input unit is shaken in a vertical direction to provide feedback through a tactile sensation has a problem in that the vibration force transmitted to the user's finger is weak. In particular, a configuration in which vibrations of the touch input unit are generated in the vertical direction has a problem in that a vibration deviation is large depending on a touch position that the larger the area of the touch input unit, the more frequent occurrence of a dead zone where the vibration force is weak on the touch input unit, and so on.

The vibration deviation problem may be solved to some extent by applying the means of vibration feedback with a large capacity. However, as the size of the means of vibration feedback increases, the capacity increases, so the size of the electrical switch incorporating the means of vibration feedback is necessarily increased. In particular, the larger the capacity, the lower the response speed to touch input, so there is a problem in that a time difference occurs between a time point of recognizing a touch through vibration feedback and a time point of the touch input.

The foregoing is intended merely to aid in the understanding of the background of the present disclosure and is not intended to mean that the present disclosure falls within the purview of the related art that is already known to those skilled in the art.

Documents of Related Art

[Patent Document]
(Patent Document 1) Korean Patent No. 10-1968944 (Issue Date: Apr. 9, 2019)

SUMMARY OF THE INVENTION

Accordingly, the present disclosure has been made keeping in mind the above problems occurring in the related art, and the present disclosure is intended to provide a haptic reactive electrical switch that may solve a problem of a dead zone where vibration force is weak by generating vibration with a uniform intensity across an entire panel regardless of a distance from a vibration source in adding a haptic function to a large-sized panel having a wide range of touch input or manipulation.

In order to achieve the above objective, according to one aspect of the present disclosure, there may be provided a haptic reactive electrical switch, the electrical switch including: a movable part including a floating panel having a touch area to which a user's touch is input and a holder configured to be coupled to the floating panel; a fixed part including a substrate and a casing configured to accommodate the substrate and be provided with at least two damping members; a vibration transmission plate configured to be interposed between the holder and the casing, thereby interconnecting the movable part and the fixed part; and an actuator installed inside the casing and configured to be operated to vibrate the holder and the vibration transmission plate coupled to the holder in a horizontal direction according to a user's touch input, wherein each of the damping member is configured in a form of a single object integrated into the casing, and an upper end part thereof protrudes to a portion above the casing, the movable part is supported in a state of being lifted at an arbitrary distance from the fixed part by the damping members protruding to the portion above the casing, and while being displaced due to horizontal vibrations of the holder and the vibration transmission plate, caused by the actuator, the damping members attenuate the horizontal vibrations.

In addition, the haptic reactive electrical switch according to the present disclosure may further include: a load detection unit configured to detect an intensity of the user's touch input input through the touch area.

Here, the load detection unit may include: a load detection rod integrally formed under a bottom surface of the holder and extending toward the substrate inside the casing; and a non-contact distance sensor mounted on the substrate to face the load detection rod at a predetermined distance.

In addition, the actuator may include: a fixed side bobbin configured to be fixed to the casing; and a movable side yoke configured to be fixed to the holder, thereby facing the fixed side bobbin, wherein the fixed side bobbin and the movable side yoke are spaced apart by a specified gap from and face each other.

In addition, the vibration transmission plate may be a plate-shaped body having a predetermined thickness and have an opening of a predetermined area that allows light of a light source mounted on the substrate to penetrate therethrough toward the touch area of the floating panel.

In addition, each of the damping members may include: a fixed piece extending vertically downward from an upper plate of the casing toward the substrate; a movable piece disposed in parallel with the fixed piece at a distance; a lower end bridge configured to interconnect lower ends of the movable piece and the fixed piece; and a connecting support piece bent at a right angle from an upper end of the movable piece in a direction away from the fixed piece and extending in a horizontal direction.

At this time, the damping members may be disposed at each of four corner regions of the casing by one.

The vibration transmission plate and the casing that constitutes the fixed part may be interconnected through a first fastening member that penetrates through the connecting support piece of each of the damping members and is fastened to a corresponding first fastening point of the vibration transmission plate, and the vibration transmission plate and the holder that constitutes the movable part may be interconnected through a second fastening member that penetrates through the holder and is fastened to a second fastening point spaced apart from the first fastening point.

Here, the second fastening point may be formed at a position separated by the same distance from each of the first fastening points located close to each corner region of the vibration transmission plate toward a vertical centerline of the vibration transmission plate.

In addition, the fixed part may further include a lower cover coupled to the casing to form a mounting space in which the substrate is mounted, wherein the substrate may be attached to a substrate extension bar that protrudes downward to a predetermined height from an upper plate of the casing and may be mounted in a state of being hung in the mounting space.

As described above, according to a haptic reactive electrical switch according to an embodiment of the present disclosure, a movable part including a floating panel to which a user's touch is input is allowed to vibrate in a horizontal direction with respect to a fixed part including a casing, thereby giving feedback to a user a uniform switch manipulation feeling without deviation by area even when the floating panel is configured in a form of a large-sized panel having a wide input or manipulation range of a switch.

In addition, when transmitting vibration feedback in a horizontal direction, there is no direct interference between a fixed part and a movable part, so it is possible to provide a clearer feeling of manipulation without noise to the user. Furthermore, an operation of an actuator is controlled by converting a degree of a load input in a non-contact manner from a change in a distance between a load detection rod and a distance sensor during touch input, thereby preventing a malfunction due to an unintentional touch from occurring.

In addition, by means of a vibration transmission plate functioning as a vibration transmission medium between the movable part and the fixed part, the vibration can be transmitted by minimizing a loss thereof not only to around the actuator, which is a vibration generating means, but also to the touch area farthest from the actuator. Accordingly, it is possible to more clearly solve a problem of a dead zone that occurs in the haptic device.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
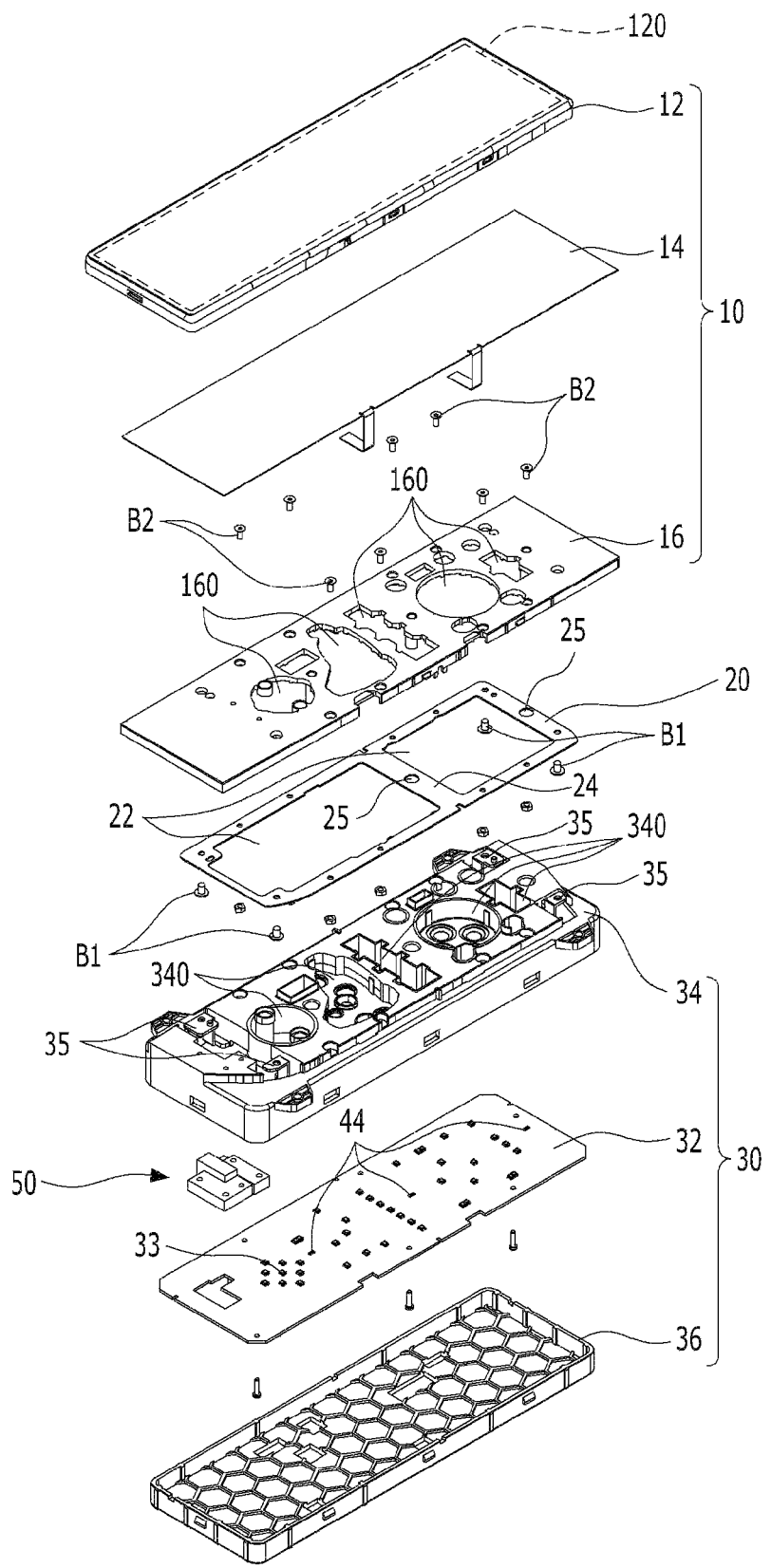
FIG. 1 is an exploded perspective view showing a haptic reactive electrical switch exploded according to an embodiment of the present disclosure.

Hereinbelow, exemplary embodiments of the present disclosure will be described in detail with reference to the accompanying drawings.

Terms used in the specification are only used to describe specific embodiments and are not intended to limit the present disclosure. A singular expression includes a plural expression unless the context clearly dictates otherwise.

It is to be understood that a term such as "comprise", "have", or the like used in the present specification is intended to designate that a feature, number, step, operation, element, part, or a combination thereof described in the specification is present and not to preclude in advance the existence or addition of one or more other features, numbers, steps, operations, elements, parts, or combinations thereof Also, terms such as first, second, and the like may be used to describe various elements, but the elements should not be limited by the terms. The above terms are used only for the purpose of distinguishing one element from another.

In addition, terms such as " . . . part", " . . . unit", " . . . module", and the like described in the specification mean a single unit that processes at least one function or operation, wherein the single unit is implemented by hardware, software, or a combination of hardware and software.

In the description with reference to the accompanying drawings, the same reference numerals will be given to the same elements, and overlapping descriptions thereof will be omitted. In addition, in the description of the present disclosure, when it is determined that a detailed description of a related known technology may unnecessarily obfuscate the gist of the present disclosure, the detailed description thereof will be omitted.

Figure 2:
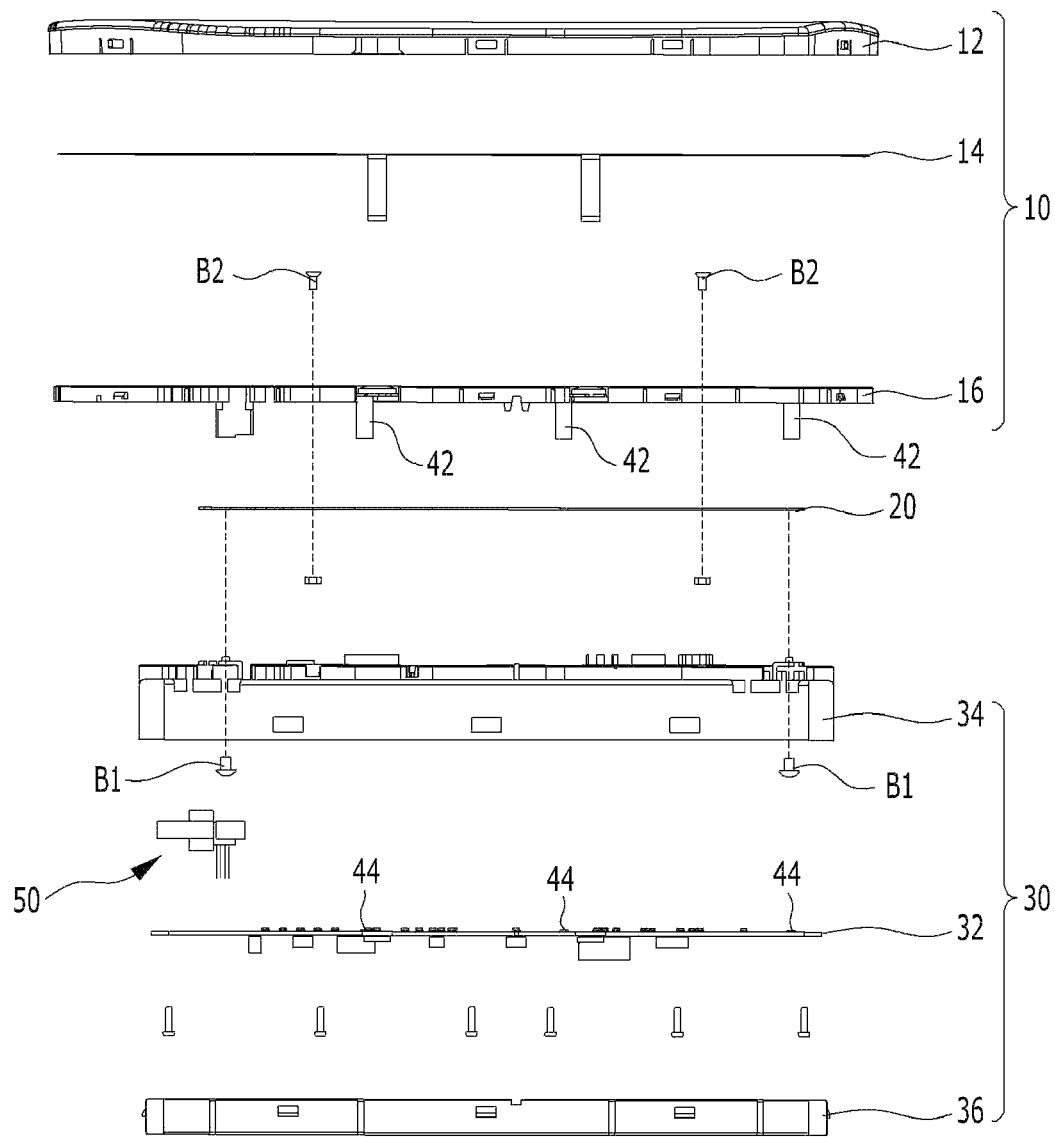
FIG. 2 is a front view of the haptic reactive electrical switch in an exploded state shown in FIG. 1.
Figure 3:
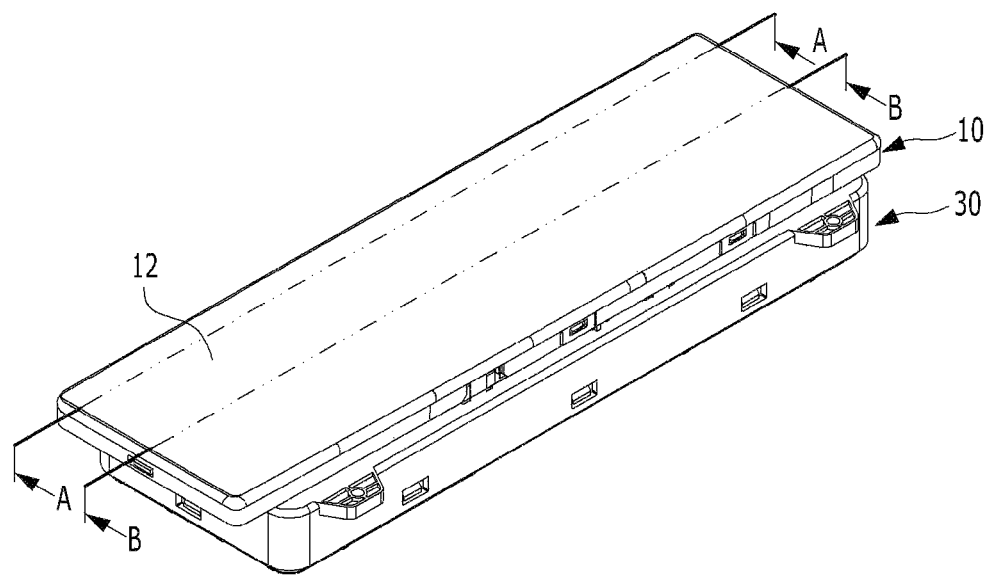
FIG. 3 is a coupled perspective view showing a state of being coupled for the haptic reactive electrical switch according to the embodiment of the present disclosure.
Figure 4:
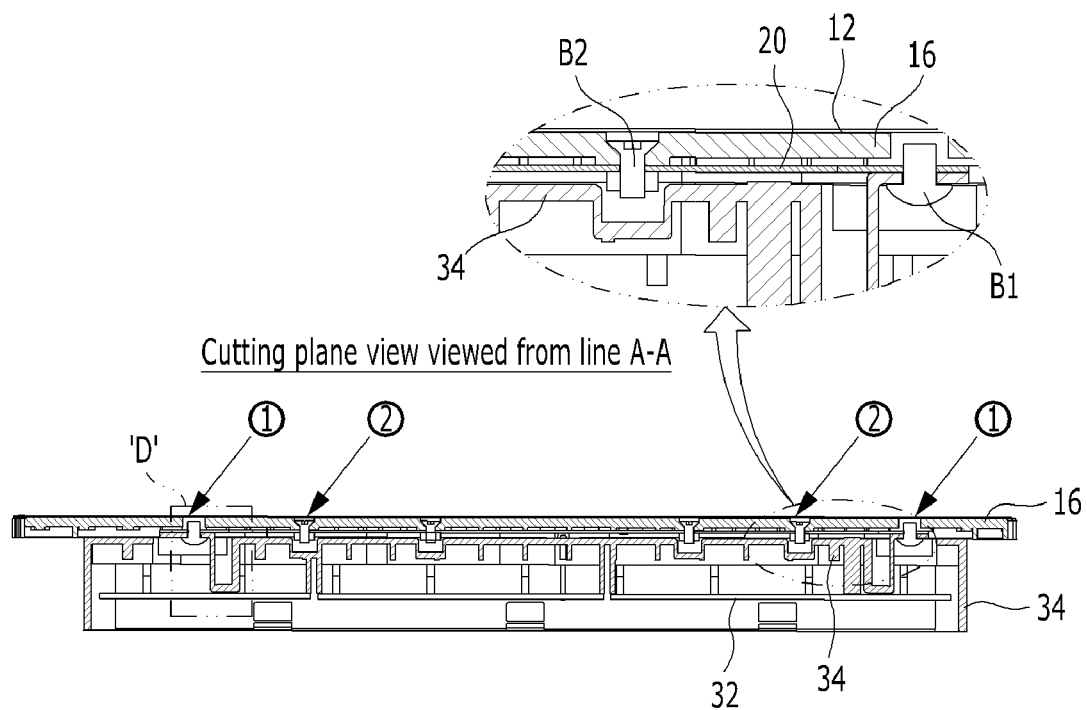
FIG. 4 is a cutting plane view of the haptic reactive electrical switch shown in FIG. 3 as viewed from line A-A.

FIG. 1 is an exploded perspective view showing a haptic reactive electrical switch exploded according to an embodiment of the present disclosure, and FIG. 2 is a front view of the haptic reactive electrical switch in an exploded state shown in FIG. 1. In addition, FIG. 3 is a coupled perspective view showing a state of being coupled for the haptic reactive electrical switch according to the embodiment of the present disclosure, and FIG. 4 is a cutting plane view of the haptic reactive electrical switch shown in FIG. 3 as viewed from line A-A.

With reference to FIGS. 1 to 4, the haptic reactive electrical switch according to the embodiment of the present disclosure is largely composed of a movable part 10 and a fixed part 30. Here, the movable part 10 and the fixed part 30 are relative concepts and may be understood that the fixed part 30 means a part fixed to the movable part 10, and the movable part 10 is a part that vibrates with respect to the fixed part.

The movable part 10 includes a floating panel 12 and a holder 16. The floating panel 12 has a touch area 120 to which a user's touch is input, and the holder 16 is coupled to the floating panel 12 at a part under the floating panel 12. The floating panel 12 and the holder 16 may be coupled to each other by the protrusions and holes (or holes and protrusions, symbols omitted) that are formed to be matched with each other on rims and circumferential surfaces thereof, respectively, and a touch film 14 configured to recognize the user's touch is interposed therebetween.

The touch area 120 of the floating panel 12 may be composed of transparent or translucent tempered glass or synthetic resin that may allow a light source 33 on a substrate 32 to be described later to make light pass therethrough and diverge to the outside, and the touch film 14 is manufactured in a size corresponding to the touch area 120 and may be attached to a rear surface of the floating panel 12 through a separate adhesive film in order to recognize a user's touch input through the touch area 120.

The holder 16 is formed with at least one front light penetration hole 160. The front light penetration hole 160 may be formed in a shape of various symbols such as a specific figure, character, sign, logo, or the like so that the user may intuitively recognize a function of a touch button. The light of the light source 33 mounted on the substrate 32 passes through the front light penetration hole 160 and illuminates from the rear surface of the floating panel 12, thereby creating a button in a specific symbol shape in the form of a two-dimensional flat design on the touch area 120.

When the user touches the button having a specific symbol shape generated in the touch area 120, the touch film 14 recognizes the touch and generates a signal corresponding thereto, and then transmits the generated signal to a controller (symbol omitted) on the substrate 32. The controller extracts a coordinate value of a position where the touch is recognized from the signal output by the touch film 14 and outputs a preset function execution command in response to the coordinate value.

The fixed part 30 includes the substrate 32 and a casing 34 configured to accommodate the substrate 32. The substrate 32 is mounted thereon with light source 33, a distance sensor, and the like in addition to the controller and may be configured to have a circuit pattern for a systematic signal transfer between components mounted thereon. Meanwhile, the casing 34 is a box-shaped structure with an open lower portion and an accommodation space formed therein and provided with at least two damping members 35 protruding to a portion above the casing 34.

By being coupled at the lower portion of the casing 34 having the lower portion open, a lower cover 36 forms a closed mounting space, capable of safely protecting the substrate 32 from an external environment, together with the casing 34. Meanwhile, the substrate 32 is attached to a substrate extension bar 37, which protrudes downward to a predetermined height from an upper plate of the casing 34, with a fastening member such as a screw (symbol omitted), and may be mounted in a state of being hung in the mounting space.

As is in an illustration of the drawing (FIG. 1), the casing 34 is formed with at least one rear light penetration hole 340. The rear light penetration hole 340 may be formed in a shape and an image exactly corresponding to the aforementioned front light penetration hole 160, and the light from the light source 33 on the substrate 32 sequentially penetrates through such rear light penetration hole 340 and front light penetration hole 160 and illuminates from the rear surface of the floating panel 12, whereby a button having a specific symbol shape (a shape corresponding to the light penetration hole) may be generated.

The movable part 10 and the fixed part 30 are interconnected through a vibration transmission plate 20 interposed therebetween. More specifically, the vibration transmission plate 20 is interposed between the holder 16 and the casing 34, thereby interconnecting the movable part 10 and the fixed part 30. The vibration transmission plate 20 is a plate-shaped body having a predetermined thickness and may be configured to have an opening 22 that has a predetermined area and allows the light from the light source 33 mounted on the substrate 32 to pass therethrough to go toward the touch region 120 of the floating panel 12.

The opening 22 formed in the vibration transmission plate 20 may be a single large-area opening as a whole or configured to be divided into a plurality of openings no less than two through a reinforcing bridge 24 as illustrated in the drawings (refer to FIG. 1 and FIG. 8A to be described later). At this time, a hole 25, through which a load detection rod 42 to be described later penetrates, may be formed when assembling the product at a position corresponding to the load detection rod 42 on one side of the edge of each of the reinforcing bridge 24 and the vibration transmission plate 20.

A part of the vibration transmission plate 20 is fixed to an upper end part of the damping member 35 configured in a form of a single object integrated into the casing 34, and an opposite part of the vibration transmission plate 20 is fixed to the holder 16. The upper end part of the damping member 35 configured in the casing 34 protrudes to the portion above the casing 34, so the movable part 10 connected to the fixed part 30 through the vibration transmission plate 20 is connected to the damping member 35 and supported in a state of being lifted at a distance from the fixed part 30.

Figure 5:
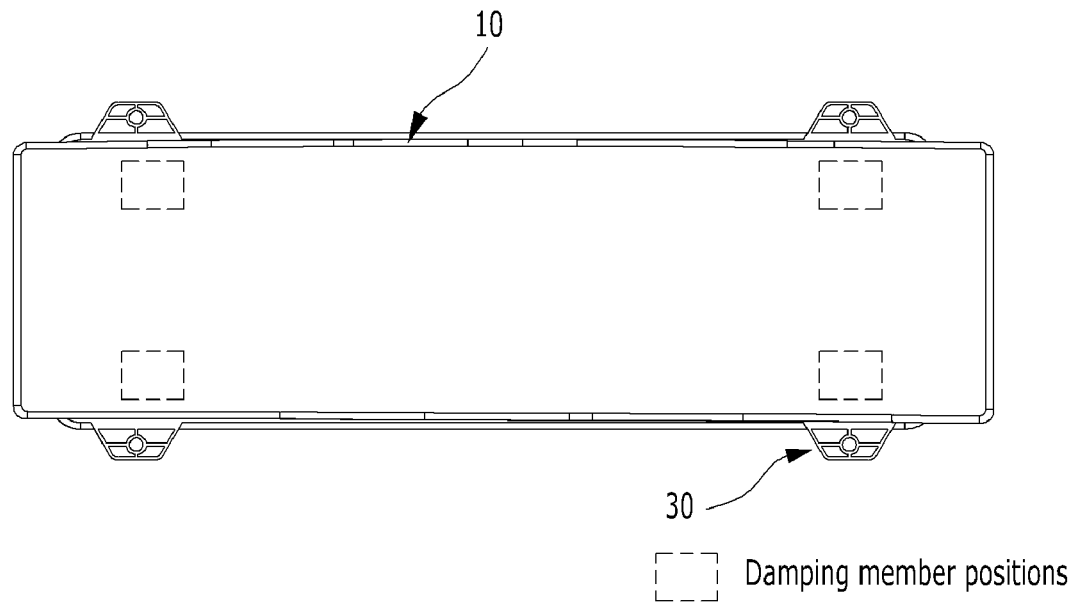
FIG. 5 is a plan view of the haptic reactive electrical switch according to the embodiment of the present disclosure.
Figure 6:
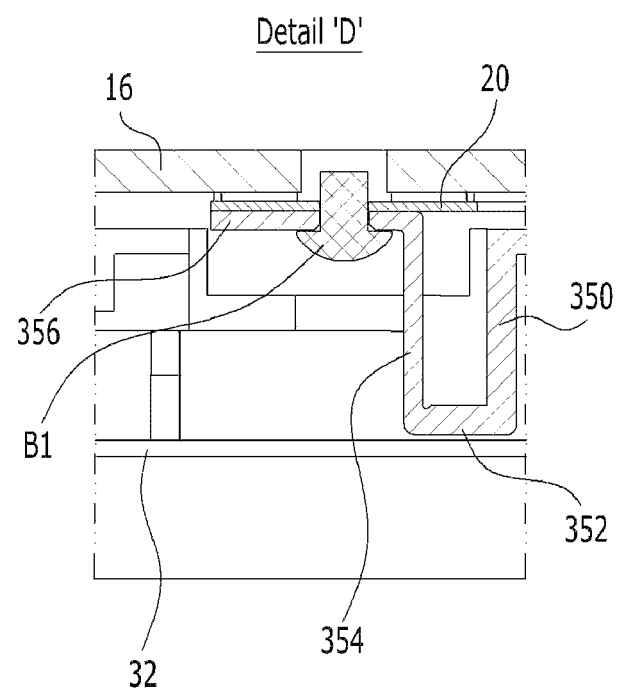
FIG. 6 is a view showing an enlarged part 'D' of FIG. 4.

FIG. 5 is a plan view of the haptic reactive electrical switch according to the embodiment of the present disclosure and is a view to show positions in which the damping members connecting a fixed part and a vibration transmission plate are formed, and FIG. 6 is a view showing an enlarged part 'D' of FIG. 4 and is an enlarged sectional view of the damping member.

As shown in FIG. 5 and the previous FIG. 1, the damping member 35 may be disposed at each of four corner regions of the casing 34 by one, but the number or position of the damping member 35 is not particularly limited to the number or position as shown in the drawing. In addition, although not shown in the drawings, in addition to the damping members 35 formed in four places, another damping means such as a spring or rubber may be additionally configured between the vibration transmission plate 20 and the casing 34.

As shown in FIG. 6, the damping member 35 may be configured to include: a fixed piece 350 connected to the casing 34 and a movable piece 354 parallel thereto; a lower end bridge 352 configured to connect the fixed piece 350 and the movable piece 354; and a connecting support piece 356 configured on an upper end of the movable piece 354.

The fixed piece 350 extends vertically downward from the upper plate of the casing 34 toward the substrate 32, and the movable piece 354 is disposed in parallel with the fixed piece 350 at an arbitrary distance. In addition, the lower end bridge 352 functions as a connection member interconnecting the lower ends of the movable piece 354 and the fixed piece 350, and the connecting support piece 356 is bent at a right angle in a direction away from the fixed piece 350 and extends in a horizontal direction.

Figure 7:
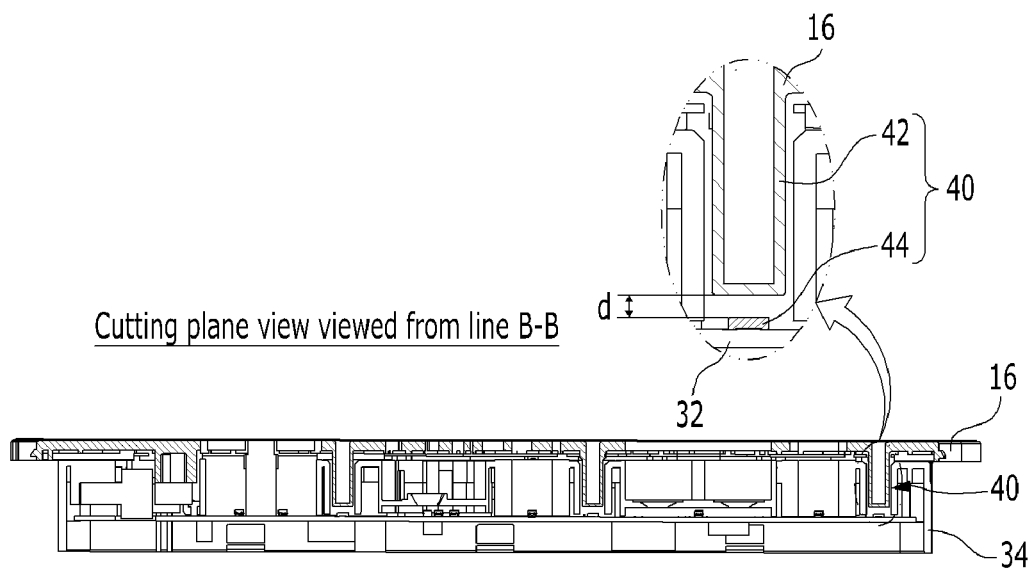
FIG. 7 is a cutting plane view of the haptic reactive electrical switch shown in FIG. 3 as viewed from line B-B.

FIG. 7 is a cutting plane view of the haptic reactive electrical switch shown in FIG. 3 as viewed from line B-B.

With reference to FIG. 7, the haptic reactive electrical switch according to the embodiment of the present disclosure also includes no less than one load detection unit 40. The load detection unit 40 is configured to detect the intensity of a user's touch input that is input through the touch area 120 of the floating panel 12 and to transmit the detected information to a controller (not shown). In this case, the controller may determine whether to operate the actuator 50, which will be described later, on the basis of information on the intensity of the touch input.

The load detection unit 40 may include a load detection rod 42 and a distance sensor 44 that are spaced apart from and disposed to face each other. The load detection rod 42 may be integrally formed under a bottom surface of the holder 16 and extend toward the substrate 32 inside the casing 34, and the distance sensor may be a non-contact distance sensor 44 mounted on the substrate 32 to face the load detection rod 42 at a predetermined distance.

When a touch is input to an arbitrary touch area of the floating panel 12 and a load is applied in a direction in which the floating panel 12 is pressed, the holder 16 coupled to the floating panel 12 and the load detection rod 42 formed under the holder 16 are moved a small distance downward. At this time, when a change in the distance d, which is detected by the distance sensor 44, between the load detection rod 42 and the distance sensor 44 is no less than a regular value, the controller may recognize it as if a normal touch is input and apply an operation signal to the actuator 50 to be described later.

That is, when a touch is input to an arbitrary touch area of the floating panel 12 and a pressing force is applied to the floating panel 12, the controller determines whether the touch input through the floating panel 12 is a normal touch intended by the user from distance information between the load detection rod 42 and the distance sensor 44, distance information being varied depending on the magnitude of the force.

Figure 8A:
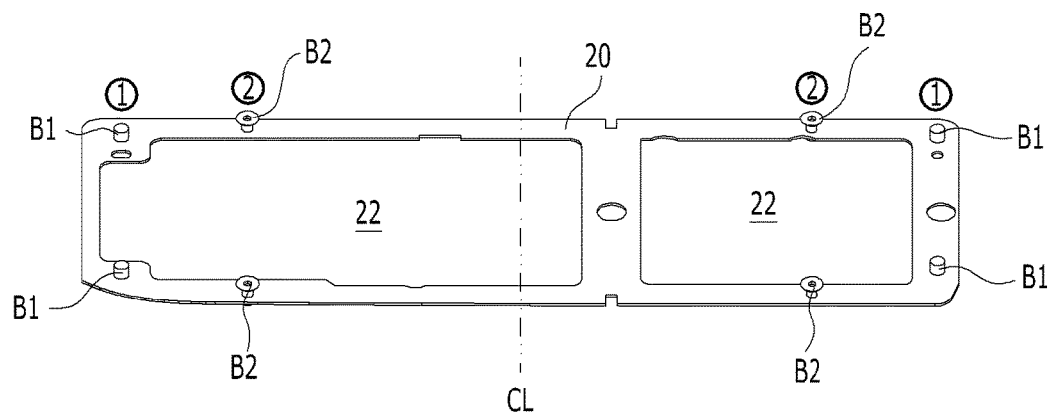
FIG. 8A is a plan view of a vibration transmission plate.
Figure 8B:
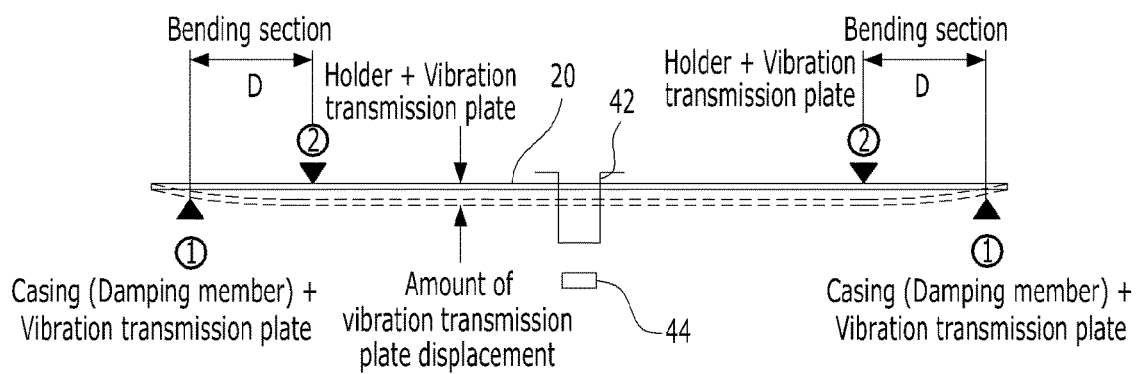
FIG. 8B is a side view showing a displacement state of the vibration transmission plate when a touch input is performed.

FIG. 8A is a plan view of a vibration transmission plate, and FIG. 8B is a side view showing a displacement state of the vibration transmission plate when a touch input is performed, wherein each of positions ① in the drawing indicates a point where the vibration transmission plate is connected to the damping member integrally formed with the casing, and each of positions ② indicates a point where the holder and the vibration transmission plate are connected to each other.

With reference to FIG. 8 and preceding FIGS. 4 and 6 together, the vibration transmission plate 20 is connected to the fixed part 30 through first fastening members B1. Specifically, the first fastening member B1 is fastened to the first fastening point (corresponding to position ① in the drawing) at a corresponding position by penetrating through the connecting support piece 356 configured in each damping member 35 from the bottom. Accordingly, the vibration transmission plate 20 and the casing 34 that constitutes the fixed part 30 may be interconnected through the first fastening member B1.

In addition, the vibration transmission plate 20 is connected to the movable part 10 being lifted at an arbitrary distance from the fixed part 30 through second fastening members B2. Specifically, the second fastening member B2 penetrates through the holder 16 constituting the movable part 10 from an upper portion, thereby being fastened to a second fastening point (corresponding to position ② in the drawing) spaced apart from the first fastening point ①. Accordingly, the vibration transmission plate 20 and the holder 16 constituting the movable part 10 may be interconnected through the second fastening members B2.

Here, the first fastening point ① is a position corresponding to the connecting support piece 356 of the damping member 35 configured in the casing 34, so the first fastening point may be positioned close to each corner region of the vibration transmission plate 20. Meanwhile, the second fastening point ② may be a position spaced apart by the same distance from each of the first fastening points ① positioned close to each corner region of the vibration transmitting plate 20 toward the vertical center line CL of the vibration transmission plate 20.

When a touch is input to an arbitrary touch area of the floating panel 12, the vibration transmission plate 20 becomes to be in bending deflection downward (refer to broken lines in FIG. 8B) with the first fastening point ① as a fulcrum by force of the touch, and the load detection rod 42 formed in the holder 16 is moved in a direction to the non-contact distance sensor 44. At this time, a degree of the bending of the vibration transmission plate 20 and the distance between the load detection rod 42 and the non-contact distance sensor 44 vary according to the intensity of the touch input.

When a user touch is input, displacement occurs in the vibration transmission plate 20 substantially in the section between the first fastening point ① and the second fastening point ②. This is because that the damping member 35 supports the vibration transmission plate 20 at the first fastening point ① in a direction opposing the input by the user, and the holder 16 is holding the vibration transmission plate 20 from above in the same direction the user touch is input at the second fastening point ②.

The amount of displacement (degree of bending) of the vibration transmission plate 20 may vary even depending on a distance (a width D of the bending section in which the bending deflection is substantially generated) between the first fastening point ① and the second fastening point ②.

More specifically, when the width D of the bending section is increased, the bending of the vibration transmission plate 20 occurs greatly even for a touch input of the same intensity, and conversely, when the width D of the bending section decreases, the bending of the vibration transmission plate 20 occurs small even for the touch input of the same intensity.

Even with the same intensity of touch input, when the degree of bending of the vibration transmission plate 20 varies according to the width D of the bending section, a vertical movement distance of the load detection rod 42 also increases or decreases in proportion to the degree of bending. As a result, even in the same intensity of the touch input, the actuator 50 may be operated by recognizing it as a normal touch or may not be operated conversely. In other words, it is implied that the operation sensitivity may be adjusted by adjusting the width of the bending section.

For example, when the width D of the bending section is a specified width, it is assumed here that the force required to displace the vibration transmission plate 20 enough to be recognized as a normal touch by touching the touch area of the floating panel 12 is "1N". Then, when the width D of the bending section is larger than the specified width, even a force smaller than "1N" may be recognized as a normal touch, thereby displacing the vibration transmission plate 20.

As such, the present disclosure may make the operation sensitivity relatively insensitive or overly sensitive on the contrary by appropriately adjusting the width D of the bending section at the design stage. Therefore, it should be noted that the distance between the first fastening point ① and the second fastening point ②, that is, the width D of the bending section is not limited to a specified width, but the width may be designed in various widths according to a request of a demand side or a required specification of the electrical switch.

An element indicated by reference numeral 50 in previous FIGS. 1 and 2 refers to an actuator that is a vibration generation element. The actuator 50 generates vibration under the control of the controller when the user's touch is recognized as a normal touch and vibrates the holder 16 and the vibration transmission plate 20 coupled with the holder 16 in a horizontal direction, so that a haptic stimulus is fed back to the user's finger.

Figure 9A:
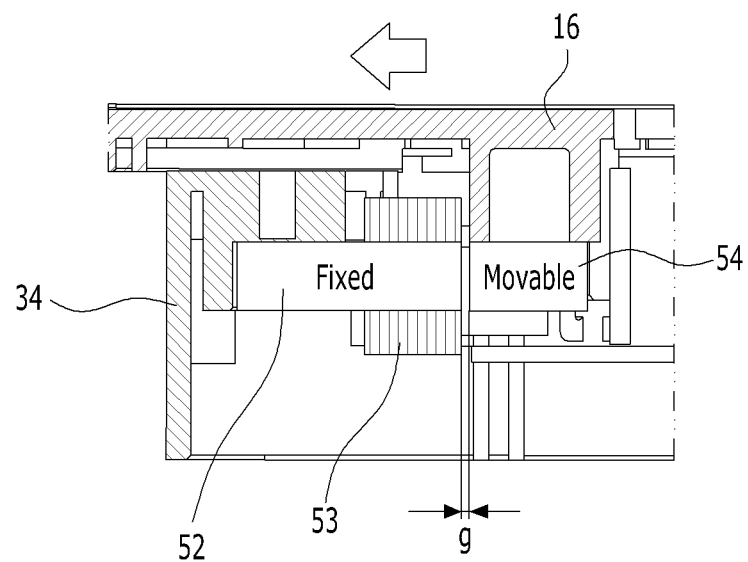
FIG. 9A is an enlarged sectional view of a main part of the present disclosure showing an enlarged portion where an actuator is mounted.
Figure 9B:
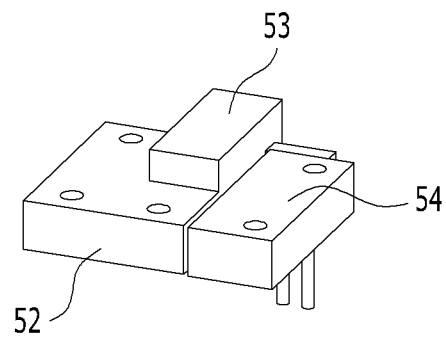
FIG. 9B is a perspective view schematically showing the actuator.

FIG. 9A is an enlarged sectional view of a main part of the present disclosure showing an enlarged portion where an actuator is mounted, and FIG. 9B is a perspective view schematically showing the actuator.

With reference to FIG. 9, the actuator 50 applied to the present disclosure may include a fixed side bobbin 52 and a movable side yoke 54. The fixed side bobbin 52 is fixed to the casing 34 and may be configured to be mounted with, or surrounded by, a coil 53 configured to be electrically connected to the substrate 32. In addition, the movable side yoke 54 is a magnetic material and may be fixed to the holder 16 so as to be spaced apart by a specified gap g from and face the fixed side bobbin 52.

A current is applied to the coil 53 under the control of the controller, and the fixed side bobbin 52 is magnetized by the current applied to the coil 53. Due to this, the interaction between the fixed side bobbin 52 and the movable side yoke 54 generates an attraction force, and the movable side yoke 54 moves in a direction to the fixed side bobbin 52, and the holder 16 and the vibration transmission plate 20 connected to the holder 16 also moves in a direction of the arrow as shown in FIG. 9A.

Figure 10A:
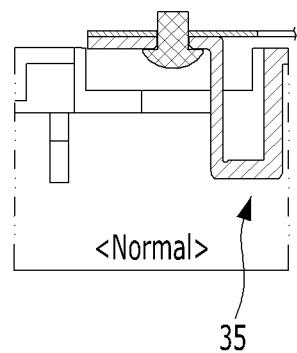
FIGS. 10A to 10D are operation state diagrams of the present disclosure and are views showing an operation state of a damping member when the actuator is operated.
Figure 10B:
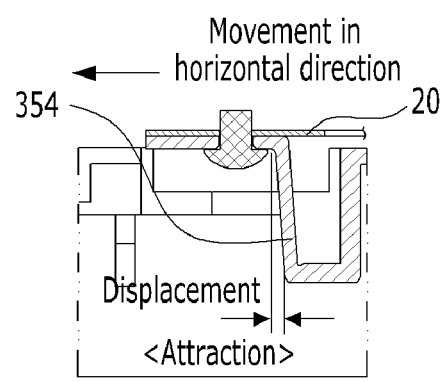

Accordingly, the force is applied in the same direction to the movable piece 354 of the damping member 35 connected to the vibration transmission plate 20, and as a result, the movable piece 354 is displaced a regular distance in the horizontal direction as shown in FIG. 10B. For reference, FIG. 10A is a view showing an initial state of the damping member 35 in a state in which there is no user touch input, that is, before current is applied to the actuator 50.

Figure 10C:
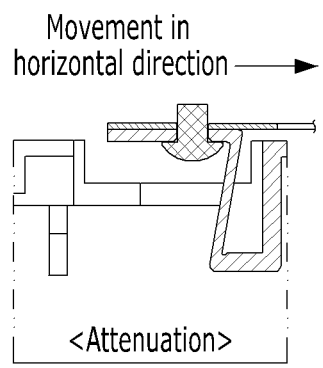
Figure 10D:
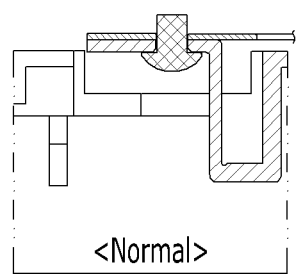

After that, when the current applied to the actuator 50 is cut off under the control of the controller, the damping member is displaced in an opposite direction to the displacement direction, to which the damping member is displaced when the current is applied, by the elastic restoring force and inertia of the damping member itself, as shown in FIG. 10C. At this time, while the states shown in FIGS. 10B and 10C are repeated, the movable part 10 is led to be vibrated in the horizontal direction and the kinetic energy thereof is gradually attenuated during the process, thereby being returned to the initial state as shown in FIG. 10D.

In the above description of the present disclosure, as an exemplary example, a configuration in which the vibration transmission plate 34 is configured independently of the holder 16 and is attached to the holder 16 through a separate fastening member B2 is shown as an example. However, even when the vibration transmission plate 34 is inserted into the holder 16 and configured in a form of one object with the holder, the same actions and effects described above may be exhibited, so it is noted that such a modification may also be within the scope of the present disclosure.

Conventional general haptic devices that shake the touch input unit in the vertical direction to provide feedback as tactile sensation have a problem in that the vibration force transmitted to the user's finger is weak. In particular, there is a problem in that a vibration deviation is large depending on a touch position that the larger the area of the touch input unit, the more frequent the dead zone where the vibration force is weak on the touch input unit, and so on.

The vibration deviation problem may be solved to some extent by applying the means of vibration feedback with a large capacity, but as the size of the means of vibration feedback increases, the capacity increases, so the size of the electrical switch incorporating the means of vibration feedback is necessarily increased. In particular, the larger the capacity, the lower the response speed to touch input, so there is a problem in that a time difference occurs between a time point of recognizing a touch through vibration feedback and a time point of the touch input.

On the other hand, according to the haptic reactive electrical switch according to the embodiment of the present disclosure, a movable part including a floating panel to which the user's touch is input is allowed to vibrate in a horizontal direction with respect to a fixed part including a casing, thereby giving feedback to the user a uniform switch manipulation feeling without deviation by area even when the floating panel is configured in a form of a large-sized panel having a wide input or manipulation range of a switch.

In addition, when transmitting vibration feedback in the horizontal direction, there is no direct interference between the fixed part and the movable part, so it is possible to provide a clearer feeling of manipulation without noise to the user. Furthermore, an operation of an actuator is controlled by converting a degree of load input in a non-contact manner from a change in a distance between a load detection rod and a distance sensor during touch input, thereby preventing a malfunction due to an unintentional touch from occurring.

In addition, by means of a vibration transmission plate functioning as a vibration transmission medium between the movable part and the fixed part, the vibration may be transmitted by minimizing a loss thereof not only to around the actuator, which is a vibration generating means, but also to the touch area farthest from the actuator. Accordingly, it is possible to more clearly solve a problem of the dead zone that occurs in the haptic device.

In the above detailed description of the present disclosure, only specific embodiments according to the description have been described. However, it is to be understood that the present disclosure is not limited to the particular form recited in the detailed description, but rather, covers all modifications, equivalents, and substitutions falling within the spirit and scope of the present disclosure as defined by the appended claims.

What is claimed is:

1. A haptic reactive electrical switch comprising:
a movable part comprising a floating panel having a touch area to which a user's touch is input and a holder configured to be coupled to the floating panel;
a fixed part comprising a substrate and a casing configured to accommodate the substrate and be provided with at least two damping members;
a vibration transmission plate configured to be interposed between the holder and the casing, thereby interconnecting the movable part and the fixed part; and
an actuator installed inside the casing and configured to be operated to vibrate the holder and the vibration transmission plate coupled to the holder in a horizontal direction according to a user's touch input,
wherein each of the damping members is configured in a form of a single object integrated into the casing, and an upper end part thereof protrudes to a portion above the casing,
the movable part is supported in a state of being lifted at an arbitrary distance from the fixed part by the damping members protruding to the portion above the casing, and
while being displaced due to horizontal vibrations of the holder and the vibration transmission plate, caused by the actuator, the damping members attenuate the horizontal vibrations.

2. The haptic reactive electrical switch of claim 1, further comprising:
a load detection unit configured to detect an intensity of the user's touch input input through the touch area.

3. The haptic reactive electrical switch of claim 2, wherein the load detection unit comprises:
a load detection rod integrally formed under a bottom surface of the holder and extending toward the substrate inside the casing; and
a non-contact distance sensor mounted on the substrate to face the load detection rod at a predetermined distance.

4. The haptic reactive electrical switch of claim 2, wherein the actuator comprises:
a fixed side bobbin configured to be fixed to the casing; and
a movable side yoke configured to be fixed to the holder, thereby facing the fixed side bobbin,
wherein the fixed side bobbin and the movable side yoke are spaced apart by a specified gap from and face each other.

5. The haptic reactive electrical switch of claim 2, wherein the vibration transmission plate is a plate-shaped body having a predetermined thickness and has an opening of a predetermined area that allows light of a light source mounted on the substrate to penetrate therethrough toward the touch area of the floating panel.

6. The haptic reactive electrical switch of claim 2, wherein each of the damping members comprises:
a fixed piece extending vertically downward from an upper plate of the casing toward the substrate;
a movable piece disposed in parallel with the fixed piece at a distance;
a lower end bridge configured to interconnect lower ends of the movable piece and the fixed piece; and
a connecting support piece bent at a right angle from an upper end of the movable piece in a direction away from the fixed piece and extending in a horizontal direction.

7. The haptic reactive electrical switch of claim 6, wherein the damping members are disposed at each of four corner regions of the casing by one.

8. The haptic reactive electrical switch of claim 7, wherein the vibration transmission plate and the casing that constitutes the fixed part are interconnected through a first fastening member that penetrates through the connecting support piece of each of the damping members and is fastened to a corresponding first fastening point of the vibration transmission plate, and
the vibration transmission plate and the holder that constitutes the movable part are interconnected through a second fastening member that penetrates through the holder and is fastened to a second fastening point spaced apart from the first fastening point.

9. The haptic reactive electrical switch of claim 8, wherein the second fastening point is formed at a position separated by the same distance from each of the first fastening points located close to each corner region of the vibration transmission plate toward a vertical centerline of the vibration transmission plate.

10. The haptic reactive electrical switch of claim 1, wherein the actuator comprises:
a fixed side bobbin configured to be fixed to the casing; and
a movable side yoke configured to be fixed to the holder, thereby facing the fixed side bobbin,
wherein the fixed side bobbin and the movable side yoke are spaced apart by a specified gap from and face each other.

11. The haptic reactive electrical switch of claim 1, wherein the vibration transmission plate is a plate-shaped body having a predetermined thickness and has an opening of a predetermined area that allows light of a light source mounted on the substrate to penetrate therethrough toward the touch area of the floating panel.

12. The haptic reactive electrical switch of claim 1, wherein each of the damping members comprises:
a fixed piece extending vertically downward from an upper plate of the casing toward the substrate;
a movable piece disposed in parallel with the fixed piece at a distance;
a lower end bridge configured to interconnect lower ends of the movable piece and the fixed piece; and
a connecting support piece bent at a right angle from an upper end of the movable piece in a direction away from the fixed piece and extending in a horizontal direction.

13. The haptic reactive electrical switch of claim 12, wherein the damping members are disposed at each of four corner regions of the casing by one.

14. The haptic reactive electrical switch of claim 13, wherein the vibration transmission plate and the casing that constitutes the fixed part are interconnected through a first fastening member that penetrates through the connecting support piece of each of the damping members and is fastened to a corresponding first fastening point of the vibration transmission plate, and the vibration transmission plate and the holder that constitutes the movable part are interconnected through a second fastening member that penetrates through the holder and is fastened to a second fastening point spaced apart from the first fastening point.

15. The haptic reactive electrical switch of claim 14, wherein the second fastening point is formed at a position separated by the same distance from each of the first fastening points located close to each corner region of the vibration transmission plate toward a vertical centerline of the vibration transmission plate.

16. The haptic reactive electrical switch of claim 1, wherein the fixed part further comprises a lower cover coupled to the casing to form a mounting space in which the substrate is mounted, wherein the substrate is attached to a substrate extension bar that protrudes downward to a predetermined height from an upper plate of the casing and is mounted in a state of being hung in the mounting space.

* * * * *